United States Patent

Mawby

[11] Patent Number: 6,104,205
[45] Date of Patent: Aug. 15, 2000

[54] PROBE WITH TAB RETAINER

[75] Inventor: Terry P. Mawby, Paola, Kans.

[73] Assignee: Interconnect Devices, Inc., Kansas City, Kans.

[21] Appl. No.: 09/030,980

[22] Filed: Feb. 26, 1998

[51] Int. Cl.[7] .............................. H01R 13/24; G01R 31/02
[52] U.S. Cl. ........................ 324/761; 324/762; 324/72.5; 439/824
[58] Field of Search .................................. 324/758, 761, 324/754, 72.5, 762; 439/708, 824, 482

[56] References Cited

U.S. PATENT DOCUMENTS

| | | | |
|---|---|---|---|
| 4,200,351 | 4/1980 | Long et al. | 339/108 TP |
| 4,397,519 | 8/1983 | Cooney | 324/761 |
| 4,659,987 | 4/1987 | Coe et al. | 324/754 |
| 4,783,624 | 11/1988 | Sabin | 324/158 P |
| 4,846,739 | 7/1989 | Mawby | 439/877 |
| 4,885,533 | 12/1989 | Coe | 324/761 |
| 4,983,909 | 1/1991 | Swart et al. | 324/754 |
| 5,032,787 | 7/1991 | Johnston et al. | 324/158 P |
| 5,045,780 | 9/1991 | Swart | 324/158 P |
| 5,134,280 | 7/1992 | Johnston et al. | 250/227.11 |
| 5,159,265 | 10/1992 | Alfonso et al. | 324/761 |
| 5,175,493 | 12/1992 | Langgard | 324/761 |
| 5,227,718 | 7/1993 | Stowers et al. | 324/158 P |
| 5,233,290 | 8/1993 | Swart | 324/72.5 |
| 5,391,995 | 2/1995 | Johnston et al. | 324/761 |
| 5,420,519 | 5/1995 | Stowers et al. | 324/754 |
| 5,521,519 | 5/1996 | Faure et al. | 324/754 |
| 5,641,315 | 6/1997 | Swart et al. | 324/72.5 |
| 5,781,023 | 7/1998 | Swart et al. | 324/761 |
| 5,850,147 | 12/1998 | Stowers et al. | 324/761 |
| 5,936,421 | 8/1999 | Stowers et al. | 324/761 |

FOREIGN PATENT DOCUMENTS 0 068 986  5/1983  European Pat. Off. ........ G01R 1/067

Primary Examiner—Josie Ballato
Assistant Examiner—Jermele M. Hollington
Attorney, Agent, or Firm—Wm Bruce Day

[57] ABSTRACT

An electrical contact test probe for use in providing electrical continuity between diagnostic equipment and a test point of an electrical circuit under test is provided. The test probe includes an elongated plunger slidably mounted within an elongated tubular barrel and extending outwardly therefrom for contacting the test point of the circuit under test. A spring is seated in the barrel and is interposed between the barrel and the plunger for biasing the plunger axially and outwardly of the barrel. The barrel consists of an elongated body having an inner bore, a generally closed end, and an open end. The barrel also has at least one cantilevered tab struck from the body and having a free end projecting into the inner bore toward the generally closed end of the barrel. The tab is located on the barrel such that the free end engages a shoulder of the plunger when the plunger is in an extended position so as to prevent outward biasing of the plunger beyond the extended position. The tab thereby retains the plunger within the barrel during the testing of the circuit.

11 Claims, 3 Drawing Sheets

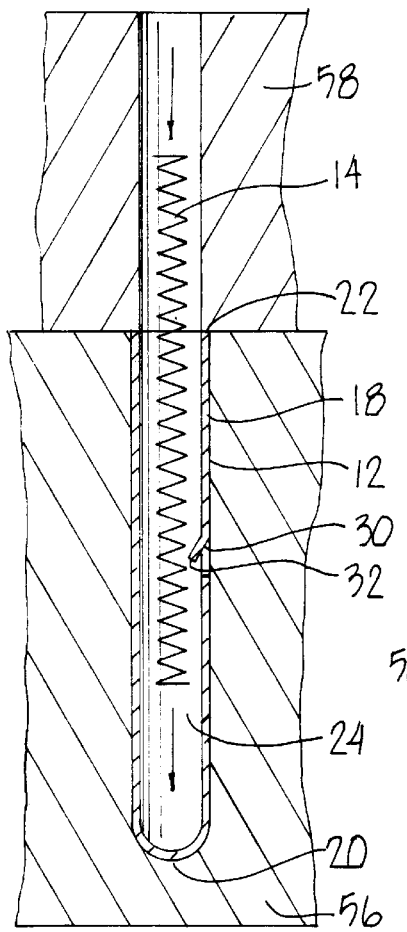
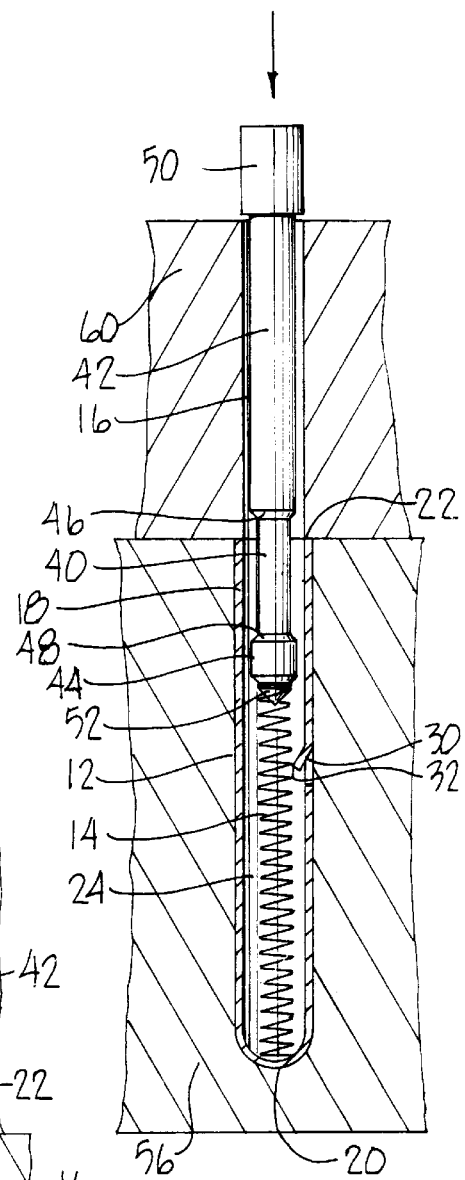
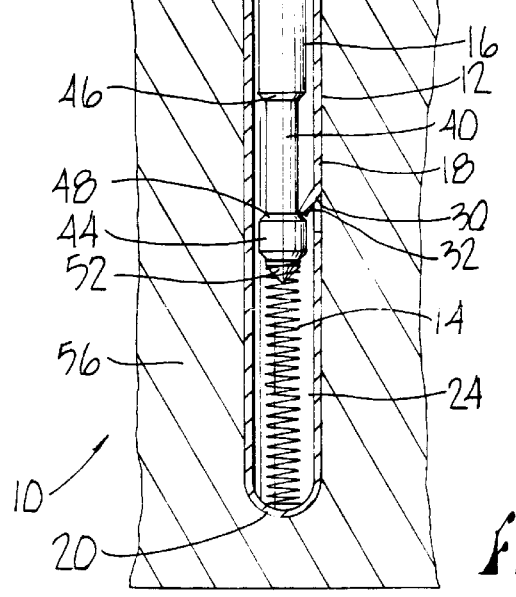
fig. 5
fig. 6
fig. 7

PROBE WITH TAB RETAINER

FIELD OF THE INVENTION

The present invention relates to electrical contact test probes and, more particularly, to spring-loaded test probes for use in the testing of a variety of electrical circuits. Such probes are generally used to provide electrical continuity between diagnostic equipment and a test point of an electrical circuit under test.

BACKGROUND OF THE INVENTION

In the automatic testing of electrical circuits, test probes are used in groups of hundreds or thousands to contact test points of an electrical circuit under test. Such test probes are inserted into receptacles which are in turn inserted into a test fixture and connected by individual wires to diagnostic equipment. The diagnostic equipment routes computer generated test routines through the test probes to the circuit under test to determine continuity and identify failure in the circuit. One such type of test probe is a spring-loaded test probe.

Conventional spring-loaded test probes generally include an elongated tubular barrel, an elongated plunger, and a spring. The barrel consists of an elongated body having an inner bore, a generally closed end, and an open end. The plunger is slidably mounted within the open end of the barrel and extends outwardly therefrom for contacting a test point of the circuit under test. The spring is seated in the generally closed end of the barrel and is interposed between the barrel and the plunger for biasing the plunger axially and outwardly of the barrel.

In such spring-loaded test probes, the plunger is retained within the spring-loaded barrel by means of either a dimple crimp or a spin crimp. That is, upon assembly of the probe, the plunger is inserted into the open end of the spring-loaded barrel, and tooling and precision machines are then used to form either a dimple crimp or a spin crimp in the body of the barrel to retain the plunger within the barrel. As such, approximately 600 probes per hour can be assembled using the spin crimp method, and approximately 1000 probes per hour can be assembled using the dimple crimp method. Thus, such spring-loaded test probes are not fully satisfactory because they involve a method of assembly which requires tooling and precision machines to form crimps in the body of the barrel, and also because they provide for a relatively low rate of assembly.

In addition, the barrels of such spring-loaded test probes are typically formed of alloys which cannot be heat treated prior to assembly. As is known in the art, heat treating the barrel of a test probe has the dual advantage of hardening and lengthening the life of the barrel, as well as increasing the conductivity of the barrel. However, if the barrels of such spring-loaded test probes were heat treated prior to assembly, the barrels would fracture upon formation of the crimp due to the hardness of the barrels. Thus, such spring-loaded test probes are also not fully satisfactory because they involve a method of assembly which is not conducive to the use of a heat treated barrel.

SUMMARY OF THE INVENTION

Therefore, it is an object of the invention to provide a new and improved test probe which can be assembled without tooling and precision machines, and which provides for a relatively high rate of assembly.

It is another object of the invention to provide a new and improved test probe which can be assembled using a heat treated barrel.

Briefly, the test probe according to the invention includes an elongated tubular barrel, an elongated plunger slidably mounted within the barrel and extending outwardly therefrom for contacting a test point of a circuit under test, and a spring seated in the barrel and interposed between the barrel and the plunger for biasing the plunger outwardly of the barrel.

In the preferred embodiment of the invention, the plunger consists of an elongated body having a middle portion spaced between an outer portion and an inner portion. The middle portion has a diameter smaller than the outer portion and the inner portion such that the middle portion forms an outer shoulder with the outer portion and an inner shoulder with the inner portion.

The barrel consists of an elongated body having an inner bore, a generally closed end, and an open end. The barrel also has at least one cantilevered tab struck from the body and having a free end projecting into the inner bore toward the generally closed end of the barrel. The tab is located on the barrel such that the free end engages the inner shoulder of the plunger when the plunger is in an extended position so as to prevent outward biasing of the plunger beyond the extended position, and thereby retain the plunger within the barrel during the testing of the circuit.

The test probe according to the invention is assembled by first inserting the spring through the open end of the barrel to a position seated in the generally closed end of the barrel. Next, the plunger is inserted through the open end of the barrel to a compressed position. Upon insertion, the inner portion of the plunger actuates the tab of the barrel so as to allow insertion of the inner portion beyond the tab of the barrel. Upon further insertion, the smaller diameter of the middle portion of the plunger allows the tab to spring into the inner bore toward the generally closed end of the barrel. Last, the plunger is released to an extended position. Upon release, the tab of the barrel engages the inner shoulder of the plunger at the extended position to thereby retain the plunger within the barrel.

As such, the test probe can be easily assembled without tooling or precision machines, and approximately 48,000 probes per hour can be assembled using this method of assembly. In addition, the barrel of the test probe can be heat treated prior to assembly of the probe to thereby harden and lengthen the life of the barrel, as well as increase the conductivity of the barrel.

An alternate embodiment of the invention includes a test probe in which the middle portion of the plunger is formed of a spiral with helical grooves. The barrel has at least two cantilevered tabs circumferentially spaced apart such that the free ends of the tabs contact the helical grooves of the plunger as the plunger reciprocates within the barrel so as to rotate the plunger about its axis during the testing of the circuit. Thus, the cantilevered tabs perform the dual function of rotating the plunger about its axis during the testing of a circuit, as well as retaining the plunger within the barrel.

BRIEF DESCRIPTION OF THE DRAWINGS

FIG. 5 is side elevational view, partly in cross-section, illustrating the insertion of the spring into the barrel according to the method of assembly of the invention;

FIG. 6 is a side elevational view, partly in cross section, illustrating the insertion of the plunger into the spring-loaded barrel according to the method of assembly of the invention;

FIG. 7 is a side elevational view, partly in cross-section, illustrating a fully assembled test probe according to the method of assembly of the invention.

DETAILED DESCRIPTION OF THE PREFERRED AND ALTERNATE EMBODIMENT

Detailed embodiments of the invention are disclosed herein, however, it is to be understood that the disclosed embodiments are merely exemplary of the invention which may be embodied in various forms. Therefore, specific structural and functional details disclosed herein are not to be interpreted as limiting, but rather merely as a basis for teaching one skilled in the art to variously employ the present invention in any appropriately detailed form, and as a basis for the claims.

Referring to FIGS. 1–4, a preferred embodiment of the test probe according to the invention is designated generally by the numeral 10.

Figure 1:
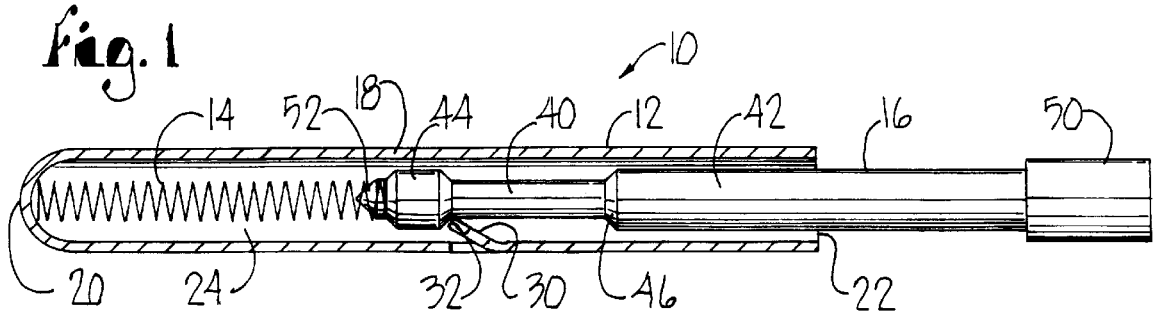
FIG. 1 is a side elevational view, partly in cross-section, of a test probe according to the invention, with the plunger shown in the extended position.

Referring to FIG. 1, the test probe 10 of the preferred embodiment generally includes an elongated tubular barrel 12, a spring 14 seated in the barrel 12, and an elongated plunger 16 slidably mounted within the barrel 12 and extending outwardly therefrom for contacting a test point of a circuit under test.

Although other designs are possible, the barrel 12 of the illustrated test probe 10 consists of an elongated body 18 extending from a generally closed end 20 to an open end 22, and having an inner bore 24.

Figure 4:
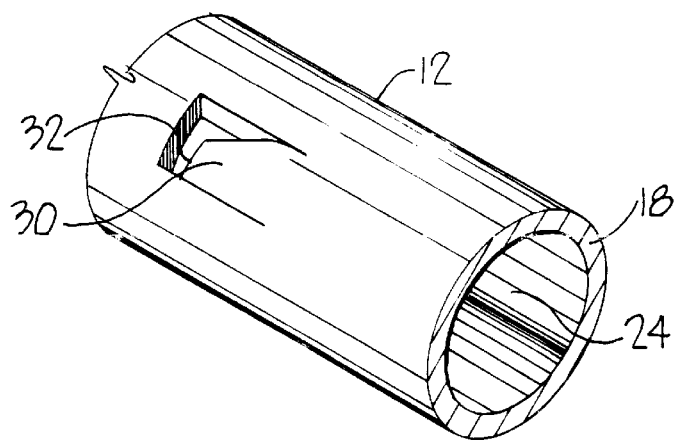
FIG. 4 is an enlarged, perspective view, illustrating the cantilevered tab of FIGS. 1–3.

The barrel 12 also has at least one cantilevered tab 30 struck from the body 18 between the generally closed end 20 and the open end 22, leaving an opening in the body 18 of the barrel 12. The tab 30 has a free end 32 which projects into the inner bore 24 toward the generally closed end 20 of the barrel 12 at an angle of 15° from the longitudinal axis. The angle of the free end 32 of the tab 30 from the longitudinal axis may vary from approximately 5° to 20° and still be effective. Preferably, the free end 32 of the tab 30 has a square edge. A detailed illustration of the tab 30 of the barrel 12 is shown in FIG. 4.

As will become apparent, the tab 30 is biased such that the free end 32 is able to swing toward the opening of the barrel 12 when actuated, and spring away from the opening of the barrel 12 and into the inner bore 24 when released. That is, the tab 30 is biased such it springs back to its original position.

Although other designs are possible, the plunger 16 of the illustrated test probe 10 consists of an elongated body having a middle portion 40 spaced between an outer portion 42 and an inner portion 44.

The outer portion 42 and the inner portion 44 of the plunger 16 have a diameter which is slightly less than the inside diameter of the body 18 of the barrel 12 such that the plunger 16 slidably mounts within the barrel 12. In the drawings, the distance between the outer portion 42 and the inner portion 44 of the plunger 16 and the inside diameter of the body 18 of the barrel 12 has been exaggerated for purposes of illustration.

The middle portion 40 has a diameter which is smaller than the diameter of the outer portion 42 and the inner portion 44 of the plunger 16, As such, the middle portion 40 forms an outer shoulder 46 with the outer portion 42 of the plunger 16 and an inner shoulder 48 with the inner portion 44 of the plunger 16. The tab 30 is located on the barrel 12 such that the free end 32 engages the inner shoulder 44 of the plunger 16 when the plunger 16 is in an extended position so as to prevent outward biasing of the plunger 16 beyond the extended position, and thereby retain the plunger 16 within the barrel 12.

The outer portion 42 of the plunger 16 has a contact head 50 for contacting a test point of a circuit under test. As is known in the art, the contact head 50 may be formed of a variety of shapes, such as a generally spear-like head which comes to a point or tip.

The inner portion 44 of the plunger 16 has a stud 52 for engaging the spring 14 of the test probe 10. As is known in the art, the stud 52 is preferably conical or inwardly tapering as it extends longitudinally away from the plunger 16.

The spring 14 of the illustrated test probe 10 is seated in the generally closed end 20 of the barrel 12 and extends into engagement with the stud 52 of the plunger 16. As such, the spring 14 springably mounts the plunger 16 within the barrel 12.

Figure 2:
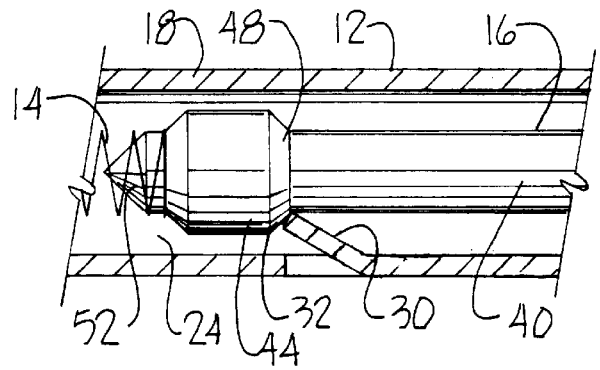
FIG. 2 is an enlarged, fragmentary, side elevational view, partly in cross-section, illustrating the engagement between the cantilevered tab of the barrel and the inner shoulder of the plunger of FIG. 1.

Referring to FIG. 1, the spring 14 biases the plunger 16 axially and outwardly through the open end 22 of the barrel 12 until the free end 32 of the tab 30 engages the inner shoulder 48 of the plunger 16 at an extended position. As such, the tab 30 prevents the outward biasing of the plunger 16 beyond the extended position. The tab 30 thereby retains the plunger 16 within the barrel 12. A detailed illustration of the engagement between the free end 32 of the tab 30 of the barrel 12 and the inner shoulder 48 of the plunger 16 is shown in FIG. 2.

Figure 3:
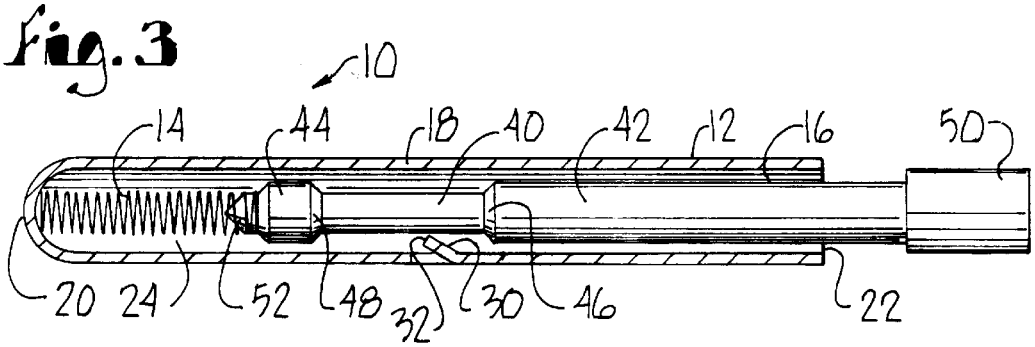
FIG. 3 is a side elevational view, partly in cross-section, of the test probe of FIG. 1, with the plunger shown in the compressed position.

Referring to FIG. 3, when the contact head 50 of the plunger 16 contacts a test point of a circuit under test, the pressure of the contact biases the plunger 16 axially and inwardly through the open end 22 of the barrel 12 to a compressed position.

Therefore, the outward biasing of the spring 14 and the inward biasing of the pressure between the contact head 50 and the test point of the circuit under test causes the plunger 16 to reciprocate within the barrel 12 between extended and compressed positions during the testing of a circuit.

Referring to FIGS. 4–7, the assembly of the preferred embodiment of the test probe 10 according to the invention is shown. Although the assembly of only one test probe will be hereinafter described, it is to be understood that plates used in the assembly of test probes can generally mount approximately 400 probes or more such that many test probes can be assembled simultaneously.

Referring to FIG. 5, the barrel 12 of the test probe 10 is mounted in a first plate 56 and the spring 14 of the test probe 10 is mounted in a second plate 58. Upon assembly, the second plate 58 is placed above the first plate 56 and the spring 14 is dropped into the barrel 12. The second plate 58 is thereby removed.

Referring to FIG. 6, the spring-loaded barrel 12, 14 is now mounted in the first plate 56 and the plunger 16 of the test probe 10 is mounted in a third plate 60. Upon assembly, the third plate 60 is placed above the first plate 56 and pressure is placed on the plunger 16 such that the plunger 16 is inserted into the spring-loaded barrel 12, 14 to a compressed position. That is, the inner portion 44 of the plunger 16 is inserted through the open end 22 of the barrel 12. Upon further insertion, the inner portion 44 of the plunger 16 actuates the tab 30 of the barrel 12 so as to allow insertion of the inner portion 44 beyond the tab 30 of the barrel 12. Upon further insertion, the smaller diameter of the middle portion 40 of the plunger 16 allows the tab 30 to spring back into the inner bore 24.

Therefore, when the pressure is removed, the plunger 16 is released to an extended position. That is, the spring 14 biases the plunger 16 axially and outwardly through the open end 22 of the barrel 12 until the tab 30 of the barrel 12 engages the inner shoulder 48 of the plunger 16, thereby retaining the plunger 16 within the barrel 12. An illustration of a fully assembled test probe 10 is shown in FIG. 7.

As is apparent, the test probe 10 of the invention can be assembled without tooling and precision machines. Also, tests have shown that approximately 48,000 test probes per hour can be assembled using the above-described method of assembly.

In addition, the barrel 12 of the test probe 10 of the invention is generally made of beryllium copper, or equivalent, and can be heat treated to Rockwell c36-42, or equivalent, prior to assembly of the test probe 10 so as to harden and lengthen the life of the barrel 12, as well as increase the conductivity of the barrel 12.

Various alternate embodiments of the test probe according to the invention which include a barrel having at least one cantilevered tab to retain the plunger within the barrel are of course possible.

Figure 8:
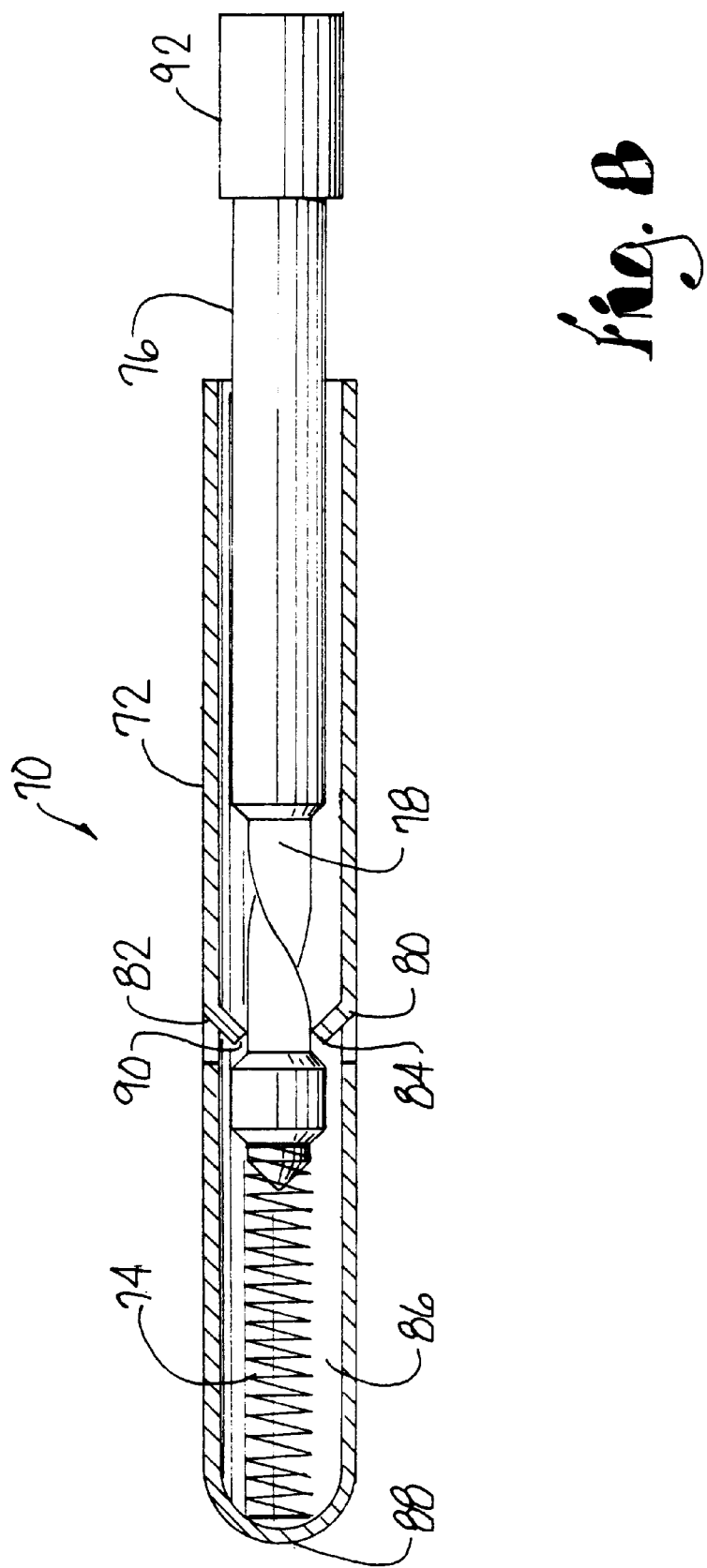
FIG. 8 is a side elevational view, partly in cross-section, of an alternate embodiment of the test probe according to the invention.

For example, referring to FIG. 8, an alternate embodiment of the test probe according to the invention is designated generally by the numeral 70. The test probe 70 includes an elongated tubular barrel 72, a spring 74 seated in the barrel 72, and an elongated plunger 76 slidably mounted within the barrel and extending outwardly therefrom for contacting a test point of a circuit under test. The test probe 70 has the same structure as the test probe 10 of the preferred embodiment, with the exception that the plunger 76 includes a middle portion 78 that has been twisted about its axis to form a spiral with helical grooves, and the barrel 72 includes a first cantilevered tab 80 circumferentially spaced from a second cantilevered tab 82. The first tab 80 has a free end 84 projecting into the inner bore 86 toward the generally closed end 88 of the barrel 72, and the second tab 82 has a free end 90 projecting into the inner bore 86 toward the generally closed end 88 of the barrel 72.

In use, the free ends 84 and 90 of the tabs 80 and 82 of the barrel 72 contact the helical grooves of the middle portion 78 of the plunger 76 as the plunger 76 reciprocates within the barrel 72 so as to rotate the plunger 76 about its axis during the testing of the circuit. As is known in the art, this rotation allows the contact head 92 of the plunger 76 to penetrate debris or film on the circuit board and make good electrical contact with a test point of a circuit under test. Therefore, the tabs 80 and 82 perform the dual function of rotating the plunger 76 about its axis as the plunger 76 reciprocates within the barrel 72 during the testing of the circuit, as well as retaining the plunger 76 within the barrel 72.

While the above invention has been described and illustrated with regard to particular embodiments, it should be apparent to those skilled in the art that various modifications are possible. For example, while certain dimensions, material compositions, and temper designations have been provided for preferred constructions of the test probe, the inventive concepts disclosed herein may be applied to test probes of a variety of manufactures. Thus, the invention is not limited to the specific forms or arrangement of parts described herein, except insofar as such limitations are included in the following claims.

What is claimed and desired to be secured by Letters Patent is as follows:

1. A test probe for providing electrical contact with a test point of a circuit under test, said probe including a barrel, a plunger slidably mounted within said barrel and extending outwardly therefrom for contacting said test point of said circuit under test, and a spring seated in said barrel for biasing said plunger axially and outwardly of said barrel, said barrel comprising:

(a) a body having an inner bore, a generally closed end, and an open end; and (b) at least one cantilevered tab struck from said body and projecting into said inner bore for stopping outward travel of said plunger when at an extended position so as to retain said plunger within said barrel upon said outward biasing of said plunger.

2. A test probe as in claim 1 wherein said tab of said barrel projects toward said generally closed end of said barrel.

3. A test probe as in claim 2 wherein said plunger comprises a middle portion spaced between an outer portion and an inner portion, said middle portion having a diameter smaller than said outer portion and said inner portion such that said middle portion forms an outer shoulder with said outer portion and an inner shoulder with said inner portion, and wherein said tab of said barrel is located on said body of said barrel such that said tab engages said inner shoulder of said plunger at said extended position to thereby provide a stop to said plunger and retain said plunger within said barrel.

4. A test probe as in claim 1 wherein said barrel is formed of beryllium copper, or equivalent, and wherein said barrel is heat treated to Rockwell c36-42, or equivalent, prior to assembly of said test probe.

5. A test probe for providing electrical contact with a test point of a circuit under test, said probe including a barrel, a plunger slidably mounted within said barrel and extending outwardly therefrom for contacting said test point of said circuit under test, and a spring seated in said barrel and interposed between said barrel and said plunger for biasing said plunger axially and outwardly of said barrel, said barrel comprising:

(a) a body having an inner bore, a generally closed end, and an open end; and (b) at least one cantilevered tab supported by said body and having a free end projecting into said inner bore toward said generally closed end for stopping outward travel of said plunger when at an extended position so as to retain said plunger within said barrel upon said outward biasing of said plunger;

(c) said contact between said plunger and said test point of said circuit under test biasing said plunger axially and inwardly of said barrel to a compressed position, said plunger thereby reciprocating between said extended and compressed positions during said testing of said circuit.

6. A test probe as in claim 5 wherein said plunger includes a middle portion spaced between an outer portion and an inner portion, said middle portion having a diameter smaller than said outer portion and said inner portion such that said middle portion forms an outer shoulder with said outer portion and an inner shoulder with said inner portion, and wherein said tab of said barrel is located on said body of said barrel such that said free end of said tab engages said inner shoulder of said plunger at said extended position to thereby prevent said outward biasing of said plunger beyond said extended position and retain said plunger within said barrel.

7. A test probe as in claim 6 wherein said middle portion of said plunger is twisted about its axis to form a spiral with helical grooves, and wherein said barrel includes at least two tabs circumferentially spaced apart such that said free ends of said tabs contact said helical grooves of said plunger as said plunger reciprocates within said barrel to thereby rotate said plunger about its axis during said testing of said circuit.

8. A test probe as in claim 5 wherein said barrel is formed of beryllium copper and heat treated to Rockwell c36-42, or equivalent, to thereby harden and lengthen the life of said barrel and increase the conductivity of said barrel.

9. A test probe for providing electrical contact with a test point of a circuit under test, said probe comprising:
  (a) a barrel, including:
    (i) a body having an inner bore, a generally closed end, and an open end; and
    (ii) at least one cantilevered tab struck from said body and having a free end projecting into said inner bore toward said generally closed end of said barrel;
  (b) a plunger slidably mounted within said barrel and extending outwardly therefrom for contacting said test point of said circuit under test, including:
    (i) an outer portion;
    (ii) an inner portion; and
    (iii) a middle portion spaced between said outer portion and said inner portion and having a diameter smaller than said outer portion and said inner portion such that said middle portion forms an outer shoulder with said outer portion and an inner shoulder with said inner portion; and
  (c) a spring seated in said barrel and interposed between said generally closed end of said barrel and said inner portion of said plunger for biasing said plunger axially and outwardly of said open end of said barrel;
  (d) said tab of said barrel located on said body of said barrel such that said free end of said tab engages said inner shoulder of said plunger at an extended position to thereby prevent said outward biasing of said plunger beyond said extended position;
  (e) said contact between said plunger and said test point of said circuit under test biasing said plunger axially and inwardly of said open end of said barrel to a compressed position;
  (f) said plunger thereby reciprocating within said barrel between said extended and compressed positions during said testing of said circuit.

10. A method of assembling a barrel, plunger, and spring of a test probe, wherein said barrel comprises a body having an inner bore, a generally closed end, and an open end, and at least one cantilevered tab struck from said body and projecting into said inner bore, said method comprising the steps of
  (a) inserting said spring through said open end of said barrel to a position seated in said generally closed end of said barrel;
  (b) inserting said plunger through said open end of said barrel to a compressed position; and
  (c) releasing said plunger to an extended position, said tab of said barrel engaging said plunger at said extended position to thereby retain said plunger within said barrel.

11. A method of assembling a barrel, plunger, and spring of a test probe, wherein said barrel comprises a body having an inner bore, a generally closed end, and an open end, and at least one cantilevered tab struck from said body and projecting into said inner bore toward said generally closed end of said barrel, and wherein said plunger comprises a middle portion spaced between an outer portion and an inner portion and having a diameter smaller than said outer portion and said inner portion such that said middle portion forms an outer shoulder with said outer portion and an inner shoulder with said inner portion, said method comprising the steps of.
  (a) inserting said spring through said open end of said barrel to a position seated in said generally closed end of said barrel,
  (b) inserting said plunger through said open end of said barrel to a compressed position, whereby upon said insertion said inner portion of said plunger actuates said tab of said barrel so as to allow insertion of said inner portion beyond said tab of said barrel, and whereby upon further insertion said smaller diameter of said middle portion of said plunger allows said tab to spring into said inner bore toward said generally closed end of said barrel; and
  (c) releasing said plunger to an extended position, whereby upon said release said tab of said barrel engages said inner shoulder of said plunger at said extended position to thereby retain said plunger within said barrel.

* * * * *